United States Patent [19]
Tokano et al.

[11] Patent Number: 5,583,637
[45] Date of Patent: Dec. 10, 1996

[54] OPTICAL ELECTRIC FIELD SENSOR USING OPTICAL COMPONENT HAVING ELECTROOPTICAL EFFECT

[75] Inventors: Yuichi Tokano; Takanobu Tanabe, both of Sendai, Japan

[73] Assignee: Tokin Corporation, Miyagi, Japan

[21] Appl. No.: 397,083

[22] PCT Filed: Jul. 7, 1994

[86] PCT No.: PCT/JP94/01102

§ 371 Date: Mar. 7, 1995

§ 102(e) Date: Mar. 7, 1995

[87] PCT Pub. No.: WO95/02191

PCT Pub. Date: Jan. 19, 1995

[30] Foreign Application Priority Data

Jul. 7, 1993 [JP] Japan ................... 5-167679
Jan. 20, 1994 [JP] Japan ................... 6-004531

[51] Int. Cl.$^6$ ................................................. G01B 9/02
[52] U.S. Cl. ................................... 356/345; 385/12
[58] Field of Search ............................ 356/345, 350, 356/358; 250/227.27, 227.19, 351; 385/12, 14, 129

[56] References Cited

U.S. PATENT DOCUMENTS 4,528,213 7/1985 Nelson et al. ...................... 427/105

FOREIGN PATENT DOCUMENTS

63-134913 6/1988 Japan .
63-241366 10/1988 Japan .

Primary Examiner—Samuel A. Turner
Attorney, Agent, or Firm—Frishauf, Holtz, Goodman, Langer & Chick

[57] ABSTRACT

An optical electric field sensor comprises optical components 2 through 4 and 11 through 13 including an optical crystal and is for measuring the intensity of an electric field, spontaneously or forcedly generated, by the use of variation of at least one of an intensity, a phase, and a polarization direction of a light beam passing through the electric field. The above-mentioned optical components are arranged and sealed in a package 7 made of at least one of a glass material such as quartz, a ceramics material, and a plastic material such as vinyl chloride having an antistatic-treated surface. More effectively, a main portion of the surface of the package 7 is subjected to abrasion. On the other hand, the optical crystal having an electrooptical effect is fixedly surrounded by a heat insulation material. The entire surface of the optical crystal substrate is coated with conductive resin. Silicone is applied in an area between modulation electrodes.

16 Claims, 8 Drawing Sheets

OPTICAL ELECTRIC FIELD SENSOR USING OPTICAL COMPONENT HAVING ELECTROOPTICAL EFFECT

TECHNICAL FIELD

This invention relates to an optical electric field sensor for use in measurement of an electric field intensity within a spatial field, typically, in EMC measurement (noise measurement).

BACKGROUND ART

An optical waveguide Mach-Zehnder interferometer has a structure in which an optical waveguide is branched and one or both of branched optical waveguides are applied with an electric field parallel to a crystal axis thereof to phase-shift light beams propagating therein, which beams are thereafter combined again. Because a light intensity after combined is varied by the electric field applied thereto, the interferometer is used as an electric field sensor for detecting, by measurement of the light intensity, an electric field intensity applied to antennas connected to electrodes. The intensity of an outgoing light beam of the Mach-Zehnder interferometer exhibits a trigonometric function wave curve with respect to the electric field applied to the electrodes.

Figures 1A, 1B, 1C:
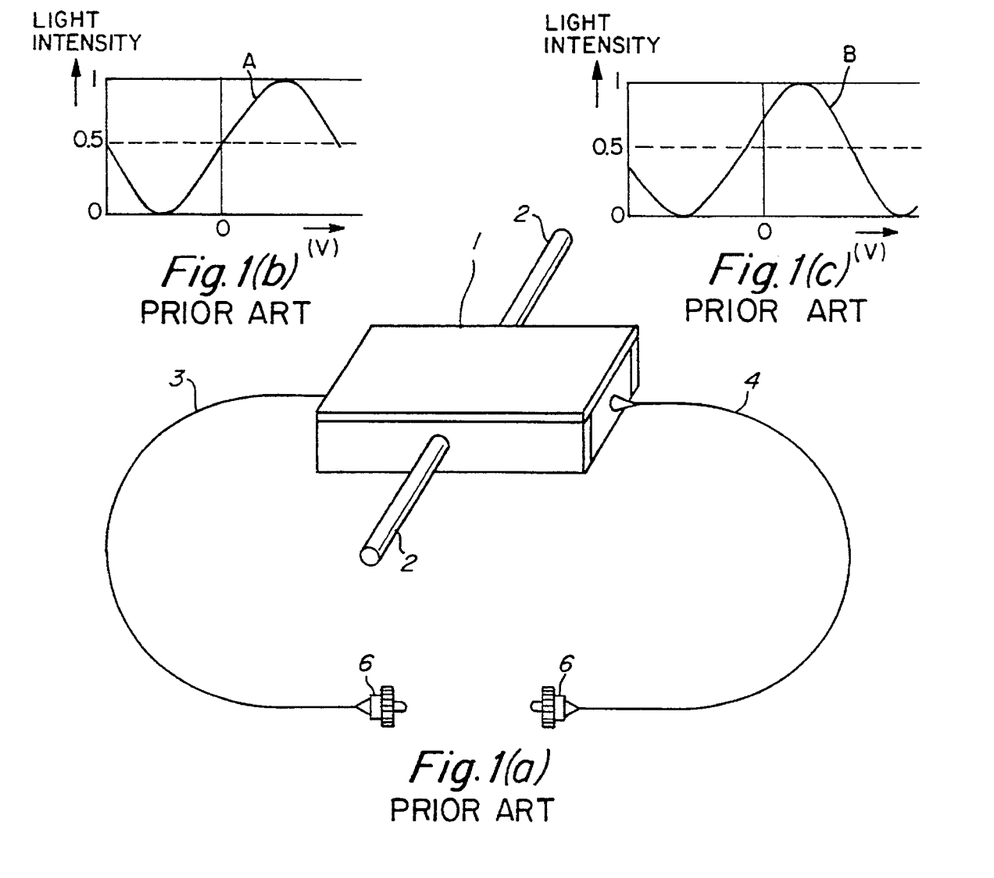
FIG. 1(a) is a view illustrating a structure of a conventional optical electric field sensor.
FIGS. 1(b) and 1(c) are views for describing an influence of a temperature upon a relationship between a light intensity and an electric field in the optical electric field sensor in FIG. 1(a)

FIG. 1(a) shows one example of a conventional optical electric field sensor. As illustrated in the figure, the optical electric field sensor comprises an optical branched waveguide type interferometer formed on an LiNbO$_3$ substrate by diffusion of Ti. One of two branched optical waveguides is provided with electrodes to form an optical modulator. The optical modulator is fixedly housed in a case 1 made of plastic. The electrodes of the optical modulator are connected to antennas 2, respectively. A polarization maintaining fiber 3 and a single mode fiber 4 are connected to a light incident side and a light outgoing side of the optical modulator, respectively. Connectors 6 are provided at the ends of fibers 3 and 4. An electric field spontaneously or forcedly generated is transmitted through the antennas to the electrodes to produce phase modulation in the optical waveguide. The light beam combined thereafter is modulated in intensity and, thus, has the light intensity corresponding to the electric field.

Figures 2A, 2B, 2C, 2D:
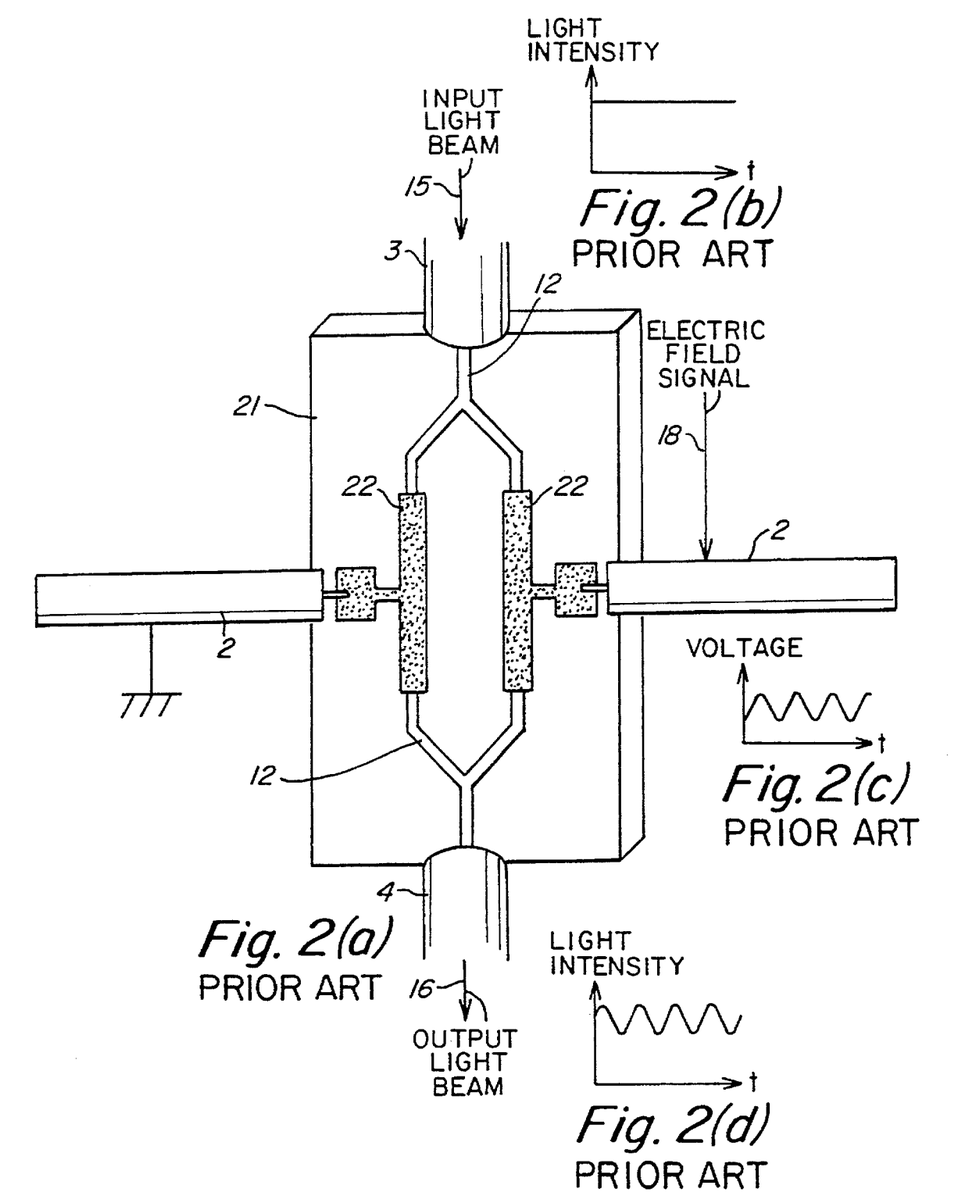
FIG. 2(a) is a plan view of the optical electric field sensor illustrated in FIG. 1(a)
FIG. 2(b) shows a relationship between the time and the light intensity of an input light beam in the optical electric field sensor in FIG. 2(a)
FIG. 2(c) shows a relationship between a voltage of an electric field signal and the time in the optical electric field sensor in FIG. 2(a)
FIG. 2(d) shows a relationship between the time and the light intensity of an output light beam in the optical electric field sensor in FIG. 2(a)

FIGS. 2(a)–2(d) show a conventional optical waveguide Mach-Zehnder interferometer used in the optical modulator illustrated in FIG. 1(a). As illustrated in FIG. 2(a), the optical waveguide Mach-Zehnder interferometer has a structure such that an optical waveguide is branched into branched optical waveguides 12 and 12 arranged on substrate 21, one or both of which are applied with an electric field 18 parallel to an optical axis through modulation electrodes 22 and 22 to provide phase-shift in the optical waveguides before being combined again. An input light beam is shown at 15 in FIG. 2(a), and an output light beam is shown at 16. Because a light intensity after combination is varied by the electric voltage applied thereto, the interferometer can be used as an electric field sensor for detecting, by measurement of the light intensity, an electric field intensity applied to antennas 2 as a low voltage applied across the modulation electrodes 22 and 22.

Figure 3:
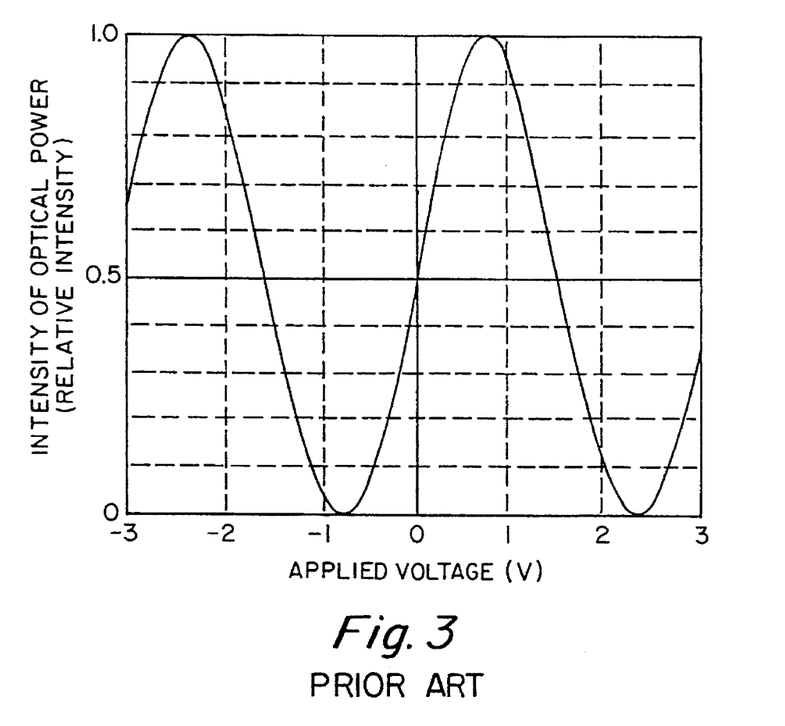
FIG. 3 shows an optical modulation characteristic with respect to an applied voltage in the optical electric field sensor in FIG. 2(a)

FIG. 3 shows an optical modulation characteristic of the Mach-Zehnder interferometer illustrated in FIG. 2(a). As illustrated in FIG. 3, an output intensity (relative intensity) of the light beam modulated in intensity by the Mach-Zehnder interferometer varies along a trigonometric function wave (sine wave) curve with respect to the applied voltage. In view of the above, adjustment (optical bias adjustment) is performed so that the light intensity is located at a linear variation point (a middle point between the maximum level and the minimum level) of the trigonometric function wave when the applied voltage is equal to 0 V. In this event, variation in light intensity and the applied electric field exhibit a proportional relationship. It is therefore possible, as an electric field sensor, to measure the applied electric field by the light intensity. In other words, such a characteristic is required for use as an electric field sensor.

The conventional optical electric field sensor, however, has a distance between the electrodes which is as small as several microns. If foreign substances, such as alkali ions, exist between the electrodes, the voltage applied across the electrodes is accumulated as a charged voltage. This results in fluctuation of an optical modulation ratio with respect to the applied voltage. Such fluctuation tends to occur in a low frequency rather than in a high frequency (DC drift, giving a largest influence upon a direct-current voltage). In that event, measurement accuracy of the optical electric field sensor is deteriorated. When the optical electric field sensor of this type is subjected to temperature variation, carrier particles are generated within a crystal, moved, and nonuniformly accumulated in the vicinity of the electrodes to produce an internal electric field. This results in instability (temperature drift) of the outgoing light beam. Such fluctuation in characteristic is great and small when the temperature variation is drastic and gentle, respectively. The temperature drift will briefly be described in conjunction with FIG. 1(b) and FIG. 1(c). Referring to FIG. 1(b), the optical electric field sensor is put in a condition where an ambient temperature is equal to 30° C. which is higher than a room temperature. An incident light beam is incident to the polarization maintaining fiber 3 (FIG. 1(a)) and passes through the conventional optical electric field sensor to be emitted from the single mode fiber 4 as a normal output light beam having a waveform A. An abscissa and an ordinate represent an applied electric field and a light intensity, respectively. Herein, adjustment is made so that the light intensity is located at a middle point between the maximum level and the minimum level when the electric field applied to the antennas is equal to 0 (V). As far as a normal operation is carried out, the waveform is as illustrated in FIG. 1(b). When subjected to the temperature drift, the output light beam emitted from the single mode fiber 4 has a waveform B illustrated in FIG. 1(c). In the waveform B, the light intensity is phase-shifted by $\pi/4$ with respect to the waveform A of the incident light beam when the electric field applied to the antennas is equal to 0 (V). Such shift is the temperature drift which deteriorates the temperature characteristic of the optical electric field sensor. As a result, the sensitivity becomes unstable.

In order to improve the temperature characteristic, the optical modulator used in the conventional optical electric field sensor adopts a method of indirect compensation. Specifically, the optical crystal is given distortion equal in magnitude and reverse in polarity to the drift by, for example, application of a physical stress caused by a Peltier element or the like, and alternatively, addition of an extra electric field reverse to the distortion the modulation electric field. As known in the art, such fluctuation in characteristic can be avoided by forming a conductive film on the surface of the substrate to cancel the electric charge within the crystal.

However, there has been no such optical electric field sensor that has a structure for suppressing heat conduction to the optical modulator, which heat conduction substantially is a cause of deterioration of the temperature characteristic. In order to monitor the output of the optical modulator, to measure the temperature drift, and to apply distortion for compensating it as described above, a device for operating these mechanisms is required. Furthermore, an accuracy is required. In addition, a typical optical modulator uses the conductive film such as a semiconductor Si film to suppress the fluctuation in characteristic. However, because sputtering or vacuum deposition is adopted therefor, there arises a problem of an increase in process time.

On the other hand, when the above-mentioned Mach-Zehnder interferometer is manufactured, the optical modulation characteristic with respect to the applied voltage generally changes in dependence upon the characteristic of the $LiNbO_3$ substrate or the manufacturing condition of the element. Specifically, it is possible to assure a reproduciability of those characteristics such as a half-wavelength voltage and a loss. However, it is difficult to adjust the light intensity at the applied voltage of 0 V to the middle point between the maximum level and the minimum level as required to the electric field sensor. In view of the above, it is a general practice to carry out adjustment (optical bias adjustment) by giving distortion to the waveguide after manufactured.

In the meanwhile, the electric field sensor has a structure in which the antennas made of metal receive the electric field to generate the applied voltage at the electrode portions of the optical modulator. When any metal other than the antenna is present around the sensor, the electric field generated around the electric field sensor is disturbed. Therefore, the package is preferably made of a nonmetallic material to remove metal components other than the antennas. Use is generally made of resin such as plastic. The electric field sensor thus manufactured is used to measure the electric field intensity on the order of several mV/m because of its characteristic, and is readily subjected to the influence of the electric field generated therearound. In addition, the package made of resin such as plastic generates an electrostatic field having such a level that fluctuates the optical bias. Since the electrostatic field generated by the package is greatly concerned with variation of humidity or the like, it is difficult to provide an element having a constant optical bias. However, in order to compensate for deviation of the optical bias due to the electrostatic field, consideration has mainly been directed to adjustment of the optical bias after packaging.

It is therefore one object of this invention to remove an electrostatic field generated by a package material after packaging as well as to improve heat insulation of an optical waveguide element so as to remove fluctuation of an optical bias due to temperature drift of a Mach-Zehnder interferometer.

It is another object of this invention to provide an optical electric field sensor which has a structure for suppressing heat conduction of thermal fluctuation outside of the optical electric field sensor to an optical crystal, to thereby dispense with the device requiring the high accuracy and to improve a temperature characteristic.

It is still another object of this invention to provide an optical electric field sensor having a conductive film formed by an inexpensive and simple process.

It is other object of this invention to provide an optical electric field sensor which is capable of inhibiting interference with an external environment to readily prevent invasion of dirt or foreign substances by applying an agent having a stable characteristic on an area between electrodes where invasion of the foreign substances is otherwise easy.

It is a further object of this invention to provide an optical electric field sensor having a structure of removing an electrostatic field generated by a package material after packaging to thereby avoid disturbance of an electric field to be measured.

SUMMARY OF THE INVENTION

According to this invention, there is provided an optical electric field sensor which comprises optical components including an optical crystal and which is for measuring the intensity of an electric field, spontaneously or forcedly generated, by the use of variation of at least one of an intensity, a phase, and a polarization direction of a light beam passing through the electric field, wherein the optical components are arranged in a package made of at least one of a heat insulation material and a plastic material having an antistatic-treated surface.

According to this invention, the heat insulation material preferably is at least one selected from a ceramics material and a glass material. Instead of the ceramics material, use may be made of a glass material including quartz. In either event, it is preferable that a surface (including an inner surface) of the package is partially or entirely subjected to abrasion (grinding).

According to this invention, the resin such as plastic, which has conventionally been used, is made to have a surface conductivity substantially equivalent to that of a semiconductor and is used as a plastic material having an antistatic-treated surface which provides an antistatic effect. The plastic material preferably comprises vinyl chloride.

According to this invention, the electric field is preferably applied through antennas connected to the optical crystal.

According to this invention, it is preferable that the package is fixedly surrounded by a heat insulation material such as expanded polystyrene foam.

According to the optical electric field sensor of this invention, the optical components are preferably arranged in a manner such that at least a pair of modulation electrodes are located in the vicinity of an optical waveguide formed on an optical crystal substrate having an electrooptical effect and an electric field spontaneously or forcedly generated is led to the pair of modulation electrodes.

According to this invention, there is provided an optical electric field sensor which comprises at least a pair of modulation electrodes located in the vicinity of an optical waveguide formed on an optical crystal substrate having an electrooptical effect and which is for measuring an electric field intensity by the use of variation of at least one of an intensity, a phase, and a polarization direction of a light beam that is caused by leading to the pair of modulation electrodes an electric field spontaneously or forcedly generated, wherein at least one of treatments is carried out which include application of conductive resin onto an entire surface of the optical crystal substrate and application of silicone between the modulation electrodes.

Specifically, according to this invention, a conductive resin film is used as the conductive film and a structure is used where the conductive film is applied onto the entire surface of the crystal substrate to cause migration and cancellation of unstable electric charge produced by temperature variation. The conductive film used must be carefully selected in respect of a resistance and a material so as not to affect the drift. According to this invention, silicone is used. This agent is excellent in isolation from the external environment, rapid in drying, and easy in application. In addition, the agent itself does not act as a foreign substance causing voltage fluctuation because of absence of any undesired unstable ions. Thus, it is noted that the agent is reliable for a long time. According to this invention, it is preferable that the optical crystal substrate is fixedly surrounded by a heat insulation material. Specifically, according to this invention, the optical modulator is fixedly housed in a case made of a heat insulation material such as a low heat conduction material, a foam-containing material, and a low heat conduction and foam-containing material. Alternatively, a case in which the optical modulator is fixedly housed is covered with a heat insulation material. Thus, heat conduction from the outside of the optical modulator is suppressed.

BRIEF DESCRIPTION OF THE DRAWING

FIG. 9 shows a relationship between an applied voltage and an output light beam in the optical electric field sensor illustrated in FIGS. 8(a) and 8(b); and.

DETAILED DESCRIPTION

Now, description will be made in detail with reference to the accompanying drawings.

First Embodiment

An optical electric field sensor according to a first embodiment of this invention has a structure similar to that of the conventional optical electric field sensor illustrated in FIG. 1(a) except that a case 1 is made of glass instead of plastic in the conventional example.

Specifically, the optical electric field sensor comprises an optical branched waveguide type interferometer formed on an $LiNbO_3$ substrate by diffusion of Ti. One of two branched optical waveguides is provided with electrodes. This optical modulator is fixedly housed in the glass case. The electrodes of the optical modulator are connected to antennas 2, respectively. A polarization maintaining fiber and a single mode fiber are connected to a light incident side and a light outgoing side of the optical modulator, respectively.

When the optical electric field sensor having the above-mentioned structure according to the first embodiment is put in an environment of 30° C. which is higher than the room temperature, no fluctuation in optical modulation characteristic is observed.

Second Embodiment

Figure 4:
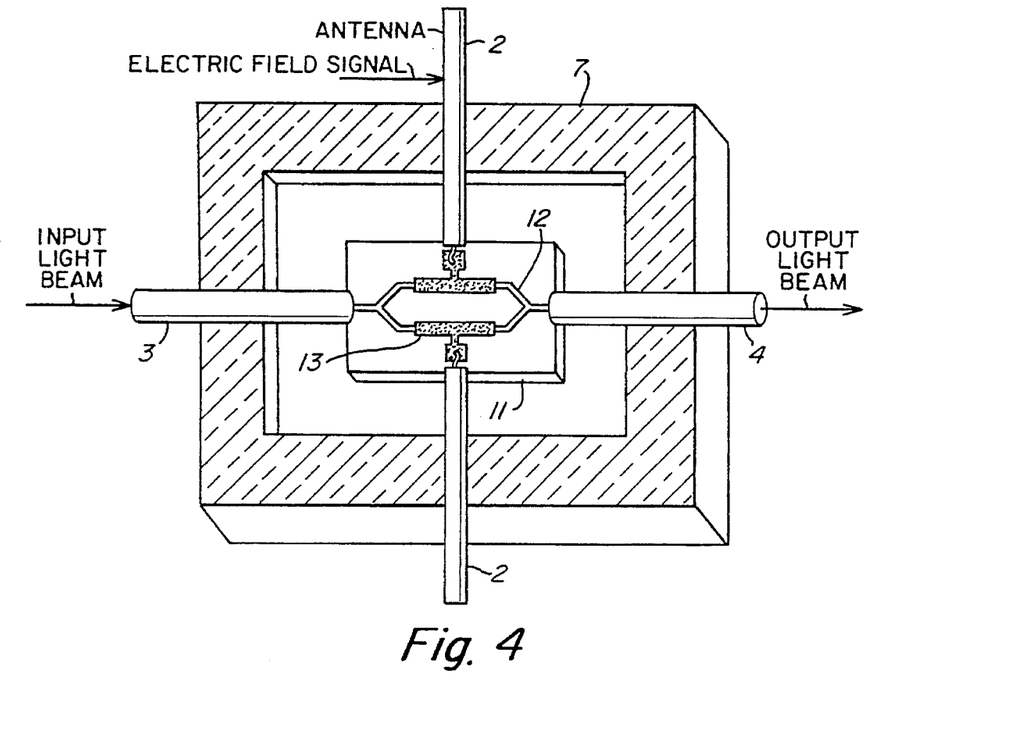
FIG. 4 is a perspective view illustrating a structure of an optical electric field sensor according to a second embodiment of this invention with an upper half of a package removed.

FIG. 4 is a slightly perspective view of an optical electric field sensor according to a second embodiment of this invention with an upper half of a quartz package removed. A Mach-Zehnder interferometer pattern was formed on a Z-cut substrate 11 (having a crystal axis in a Z direction) of $LiNbO_3$ by a Ti pattern. Then, optical waveguides 12 were formed by thermal diffusion. Thereafter, an $SiO_2$ film was formed on a surface on the optical waveguides 2. Modulation electrode patterns 13 were formed thereon. For input and output of a laser beam, the optical waveguide 12 was subjected to face polishing. A constant polarization optical fiber 3 and a single mode fiber 4 were connected to a light incident side and a light outgoing side, respectively. Those elements thus manufactured had the optical modulation characteristics as illustrated in FIG. 2 and described in the foregoing. Selection was made of an optimum one as an optical electric field sensor. Thereafter, antennas 2 for electric field detection were connected to modulation electrodes 13. An entire arrangement was housed in the quartz package 7. The package was made up by the use of an organic adhesive and sealed so that the internal element is not affected by an outside air. For the sake of comparison, a conventional optical electric field sensor was prepared by the use of a package made of acrylic plastic. It was noted here that those elements were selected to have a same optical modulation characteristic.

In order to demonstrate the effect of this invention, each element was wrapped by acrylic sponge and left at the room temperature for one day with the electrodes short-circuited, so as to generate an electrostatic field by the package. Then, the optical modulation characteristic of each optical electric field sensor was measured. In the conventional optical electric field sensor, fluctuation of the optical bias was observed. On the other hand, no fluctuation was found in the optical electric field sensor of this invention. With respect to variation of the ambient temperature, no fluctuation of the optical bias was observed in the optical electric field sensor of this invention using the quartz package even in a condition (10° C. higher than the room temperature) where fluctuation of the optical bias is caused in the conventional optical electric field sensor with the package made of acrylic plastic.

A similar comparison was made as regards another optical electric field sensor according to this invention. In this optical electric field sensor, the quartz package was subjected to the abrasion process. In this event, a more excellent result was obtained as compared with the above-mentioned case. With the package made of ceramics, a similar result was obtained as in case of quartz.

By the use of the package made of glass (quartz) or ceramics, the above-mentioned optical electric field sensor according to the second embodiment of this invention achieves stable characteristics without variation of the optical modulation characteristic after assembling and without fluctuation of the optical bias in response to the temperature variation from the room temperature. Because heat insulation of the element is stable in the optical electric field sensor according to the first embodiment of this invention, no consideration is required of the influence of the temperature drift as far as it is used at the room temperature (mainly used in an EMC measurement within a radio dark room, which is carried out in an environment of the room temperature). It is therefore possible to provide an optical electric field sensor manufactured with a high productivity by removing a process for making any way against the temperature drift.

By the use of such a technique in the second embodiment of this invention, no electrostatic field is generated by the package material and the influence of the variation of the ambient temperature upon variation of the temperature within the package is reduced.

Third Embodiment

Figures 5A, 5B, 5C:
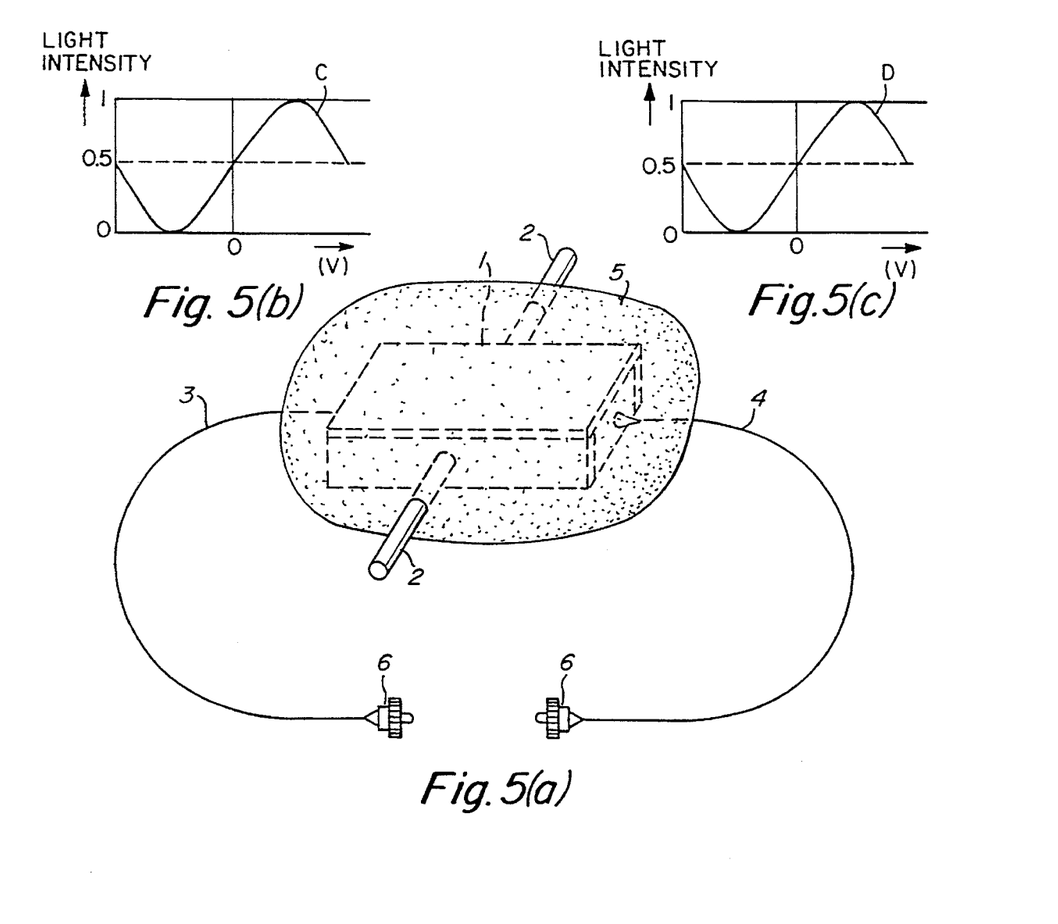
FIG. 5(a) shows an optical electric field sensor according to a third embodiment of this invention.
FIGS. 5(b) and 5(c) are views for describing an influence of a temperature upon a relationship between a light intensity and an electric field in the optical electric field sensor in FIG. 5(a)

FIGS. 5(a)–5(c) show an electric field sensor according to a third embodiment of this invention. As illustrated in FIG. 5(a), an optical branched waveguide type interferometer is prepared on an LiNbO$_3$ substrate by diffusion of Ti. One of two branched optical waveguides is provided with electrodes. This optical modulator is fixedly housed in a glass case 1. The electrodes of the optical modulator are connected to antennas 2. A polarization maintaining fiber 3 and a single mode fiber 4 are connected to a light incident side and a light outgoing side of the optical modulator, respectively. A combination of those components forms the optical electric field sensor. In FIG. 5(a), the optical electric field sensor is put in a condition where the ambient temperature of the optical electric field sensor is 30° C. A light beam is incident to the polarization maintaining fiber 3 and passes through the optical electric field sensor to be emitted from the single mode fiber 4 as a normal outgoing light beam having a waveform C. An abscissa and an ordinate represent an applied electric field and a light intensity, respectively. Herein, adjustment is made so that the light intensity is located at a middle point between the maximum level and the minimum level when the electric field applied to the antenna is equal to 0 (V). The foregoing structure is similar to that of the first embodiment. The optical electric field sensor according to the third embodiment of this invention is different from the first embodiment in that it is covered by expanded polystyrene foam 5 having a heat insulation effect.

In the optical electric field sensor according to the third embodiment of this invention, a light beam is incident to the polarization maintaining fiber 3 and passes through the optical electric field sensor to be emitted from the single mode fiber 4 as a normal outgoing light beam having a waveform C as illustrated in FIG. 5(b). Adjustment of a zero point is carried out so that the light intensity is located at a middle point between the maximum level and the minimum level when the electric field applied to the antenna is equal to 0 (V), as is similar to the conventional case. However, as illustrated in FIG. 5(c), a difference exists in that a waveform D of the outgoing light beam emitted from the single mode fiber 4 is coincident with the waveform C without being subjected to the temperature drift. Specifically, in the waveform D, the light intensity is equal to 0 (V) when the electric field applied to the antennas is equal to 0 (V). Thus, the waveform is not varied from the waveform C of the normal outgoing light beam. As described, the expanded polystyrene foam 5 suppresses the temperature drift (see FIG. 1(c)) of the optical electric field sensor to achieve an excellent temperature characteristic and a stable sensitivity.

From the above-mentioned result, it is understood that the optical electric field sensor using a material having a heat insulation effect according to the third embodiment of this invention can suppress the influence of the temperature drift resulting from variation of the ambient temperature to improve a temperature characteristic and to keep a stable sensitivity of the sensor. According to the third embodiment of this invention, the influence of variation of the ambient temperature of the optical electric field sensor upon the optical crystal of the optical modulator is suppressed to be small. It is therefore possible to provide an optical electric field sensor having an excellent temperature characteristic. According to the third embodiment of this invention, it is possible not only to contribute to the improvement of the temperature characteristic of the optical electric field sensor, which is a problem in prior art, but also to provide an optical electric field sensor manufactured at a relatively low cost in a reduced process time with a high productivity.

Fourth Embodiment

Figure 6A:
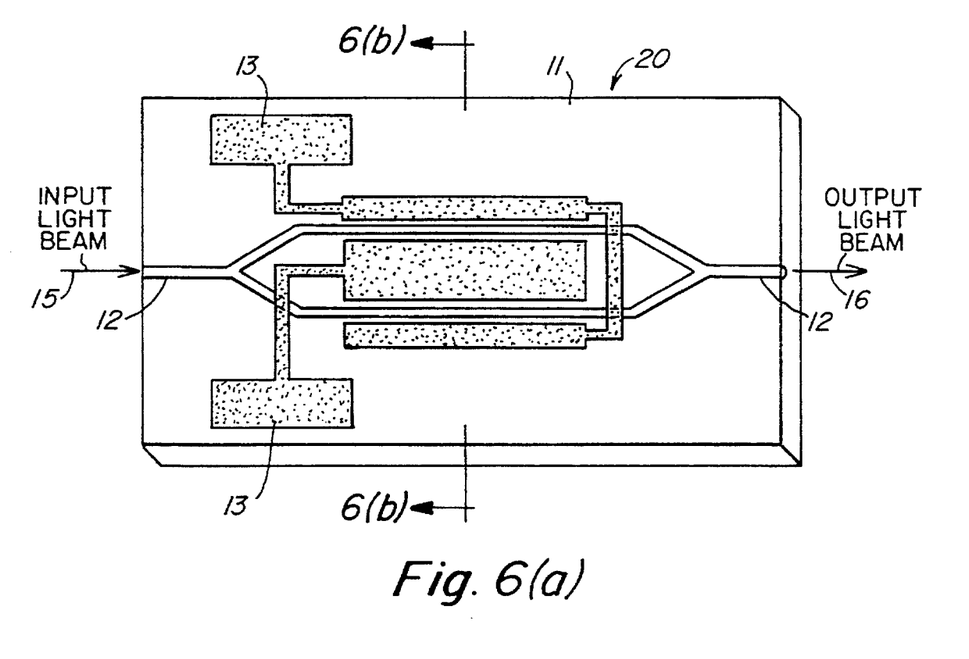
FIG. 6(a) is a plan view of an optical electric field sensor according to a fourth embodiment of this invention.
Figure 6B:
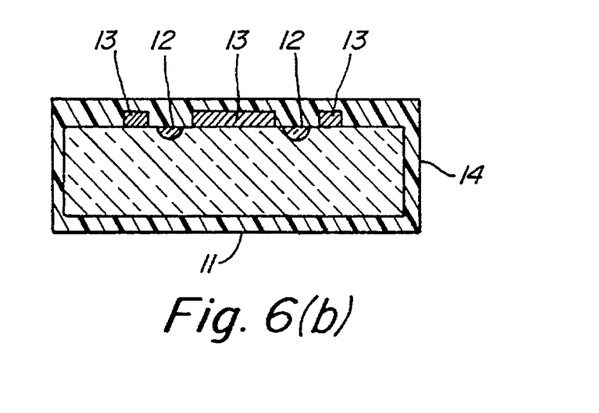
FIG. 6(b) is a sectional view of the optical electric field sensor in FIG. 6(a) taken along line 6(b)—6(b) of FIG. 6(a)

FIGS. 6(a) and 6(b) show a main portion of an optical electric field sensor according to a fourth embodiment of this invention. As illustrated in FIGS. 6(a) and 6(b), a Ti (film thickness of 800 A) thermal diffusion optical waveguide (hereinafter simply called an optical waveguide) 12 was formed on a X-cut substrate 11 of LiNbO$_3$ crystal as a branch interference type optical waveguide which is branched and again joined together. Modulation electrodes 13 were arranged in an area after being branched and before joined again. Thus, a Mach-Zehnder optical interferometer 20 was manufactured. On opposite ends of the element, two short dipole antennas (not shown) of 75 mm were connected to the modulation electrodes 13 in the manner similar to FIG. 2(a). A constant polarization optical fiber and a single mode optical fiber were connected to a light input side 15 and a light output side 16, respectively (not shown). An input light beam was a laser light beam having a wavelength of 1.3 μm. An output light beam was subjected to O/E conversion for measurement. A direct current voltage 18 was applied to the short dipoles of the optical electric field sensor thus manufactured. A half-wavelength voltage $V_\pi$ was obtained from the intensity variation of the optical output in response to the applied voltage.

Figure 7:
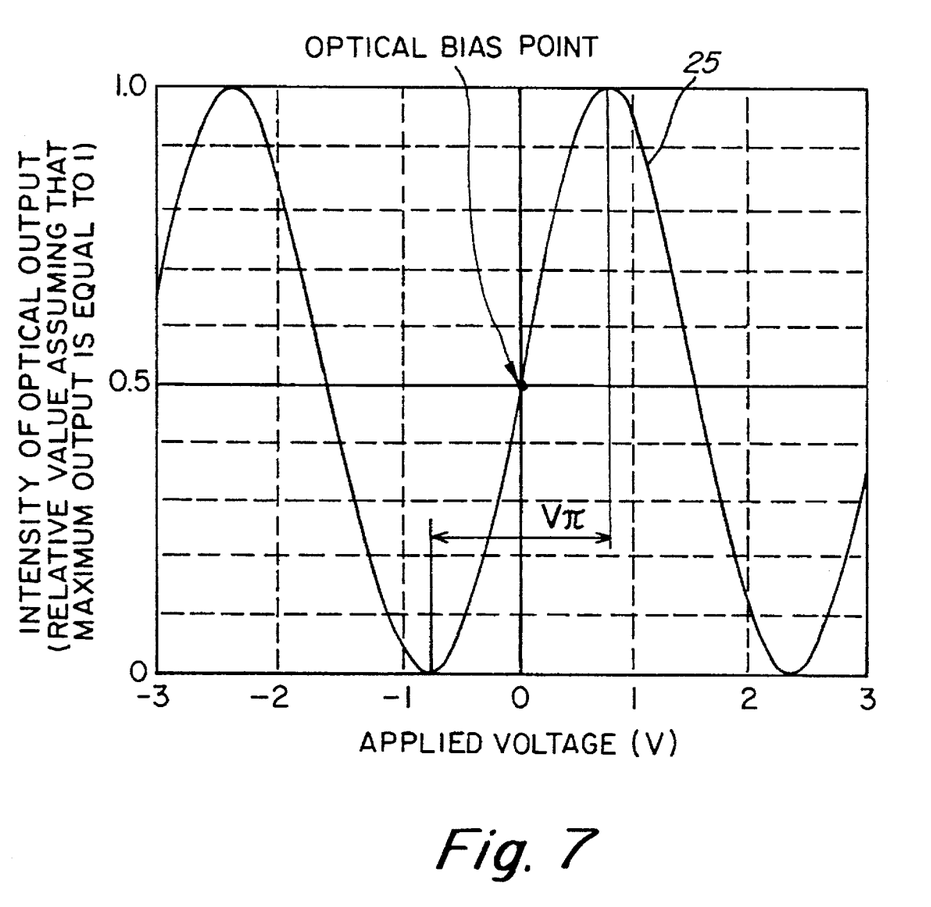
FIG. 7 shows a relationship between an applied voltage and an output light beam in the optical electric field sensor in FIGS. 6(a) and 6(b)

By the use of a conductive spray of this invention, as shown in FIG. 6(b), a conductive resin film 14 was formed (process time being on the order of 5 seconds per one) on the optical modulator portion of the optical electric field sensor thus manufactured. In a thermostatic chamber, variation of the intensity of the outgoing light beam in response to temperature variation was confirmed. The temperature was varied stepwise by 10° C. in a range between −10° C. and 60° C. For the sake of comparison, a similar test was carried out for the optical electric field sensor without treatment by the conductive spray. The test data were dealt with in the form of voltage shift which is obtained from the light intensity with reference to an SG curve 25 in FIG. 7 and normalized by the half-wavelength voltage V.

The optical electric field sensor without using the conductive spray was unstable in light intensity, the level of which fluctuated even around 25° C. With respect to the temperature variation, a shift not smaller than the half-wavelength voltage was confirmed. On the other hand, the optical electric field sensor according to this invention exhibited no variation in light intensity even around 25° C. It was confirmed that the shift in the optical bias is not greater than ±0.3% (normalized by the half-wavelength voltage) in an environment of the temperature between −10° C and 60° C.

The above-mentioned result shows that the fourth embodiment of this invention is effective in improvement of the temperature characteristic of the optical electric field sensor. Also from the fourth embodiment, it is confirmed that this invention greatly contributes to improvement of productivity because manufacture is easily carried out at a very low cost as compared with the conventional case. Accordingly, it is found out that the fourth embodiment of this invention provides an optical electric field sensor with a conductive film formed by an inexpensive and simple process.

Fifth Embodiment

Figure 8A:
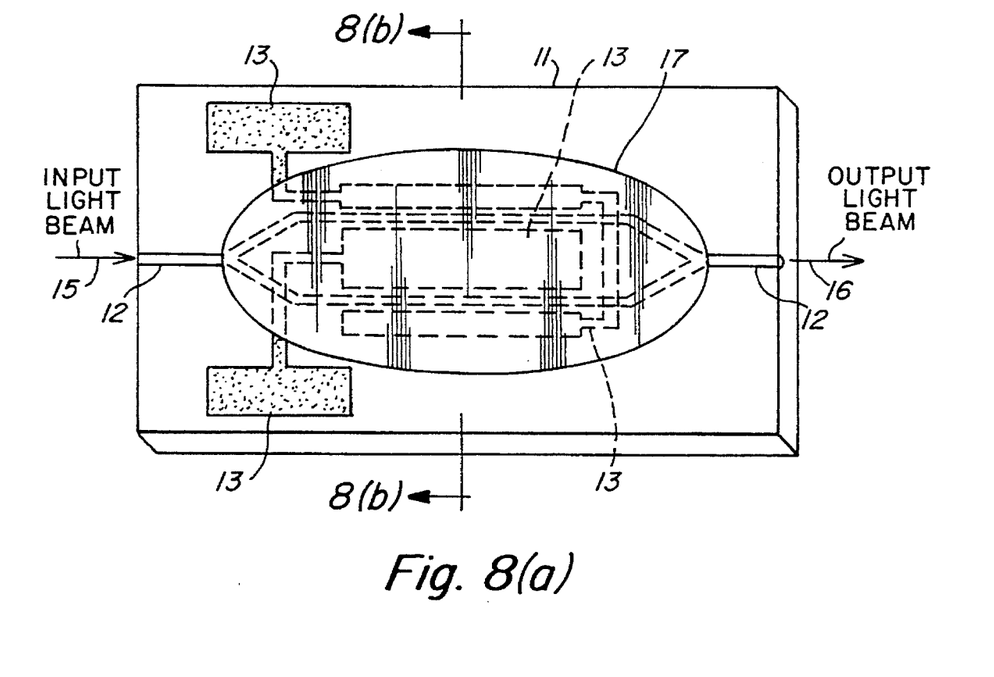
FIG. 8(a) is a plan view of an optical electric field sensor according to a fifth embodiment of this invention.
Figure 8B:
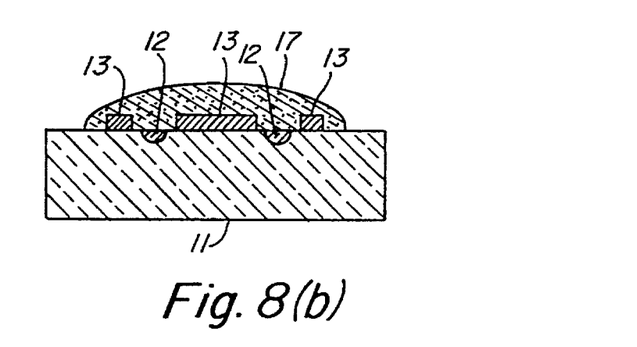
FIG. 8(b) is a sectional view of the optical electric field sensor in FIG. 8(a) taken along line 8(b)—8(b) of FIG. 8(a)
Figure 9:
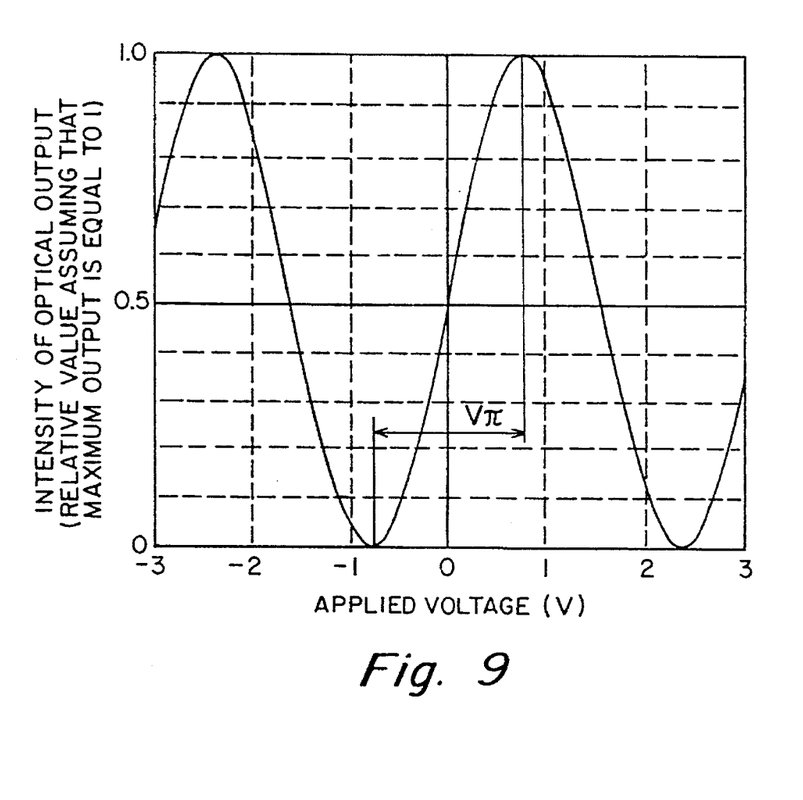

FIGS. 8(a) and 8(b) show a main portion of an optical electric field sensor according to a fifth embodiment of this invention. As illustrated in FIGS. 8(a) and 8(b), a Ti (film thickness of 800 A) thermal diffusion optical waveguide 12 was formed on a X-cut substrate 11 of $LiNbO_3$ crystal as a branch interference type optical waveguide which is branched and again joined together. Modulation electrodes 13 were formed in an area after branched and before joined again. Thus, a Mach-Zehnder optical interferometer was manufactured in the manner similar to the fourth embodiment. In the fifth embodiment, silicone 17 was applied onto a region including the modulation electrodes 13 adjacent to the optical waveguide 12. On opposite ends of the element, two short dipole antennas of 75 mm were connected to the modulation electrodes 13. A constant polarization optical fiber and a single mode optical fiber (not shown) were connected to a light input side and an output side, respectively. An input light beam was a laser light beam having a wavelength of 1.3 μm. An output light beam was subjected to O/E conversion for measurement. A direct current voltage was applied to the short dipoles of the optical electric field sensor thus manufactured. A half-wavelength voltage $V_\pi$ was obtained from the intensity variation of the optical output in response to the applied voltage. The result was illustrated in FIG. 9. The optical electric field sensor thus manufactured was applied with a DC voltage (12 V), which tends to cause characteristic deterioration, and left for 100 hours. Then, the DC drift was measured. Likewise, the sample without being applied with silicone was measured for comparison.

After measurement, a test was carried out for 100 hours at a constant temperature and humidity of 60° C. and 60% which was a bad environment realized by the use of common tap water for humidification. Then, the DC drift was similarly measured. As a result, the time period until the initial DC drift is caused was unchanged in the sample applied with the silicone. On the other hand, the time period was reduced more than 10 times in the sample without being applied with the silicone. According to the fifth embodiment of this invention, the agent having a stable characteristic, namely, having no undesired ions and a high reliability, is applied in an area between the electrodes, where any foreign substance tends to invade. It is therefore possible to provide an optical electric field sensor which is capable of inhibiting interference with an external environment to readily prevent invasion of dirt or a foreign substance. It is confirmed that, by the use of the optical electric field sensor according to the fifth embodiment of this invention, a stable optical electric field sensor is provided which can suppress variation of the DC drift although a process is very simple. In addition, according to the fifth embodiment of this invention, it is possible to provide an optical electric field sensor having a characteristic stable for a long time, inasmuch as invasion of a foreign substance is avoided during application of silicone. Since no special facility is required and the operation itself is very easy, no substantial increase in process time is required.

Sixth Embodiment

Figure 10:
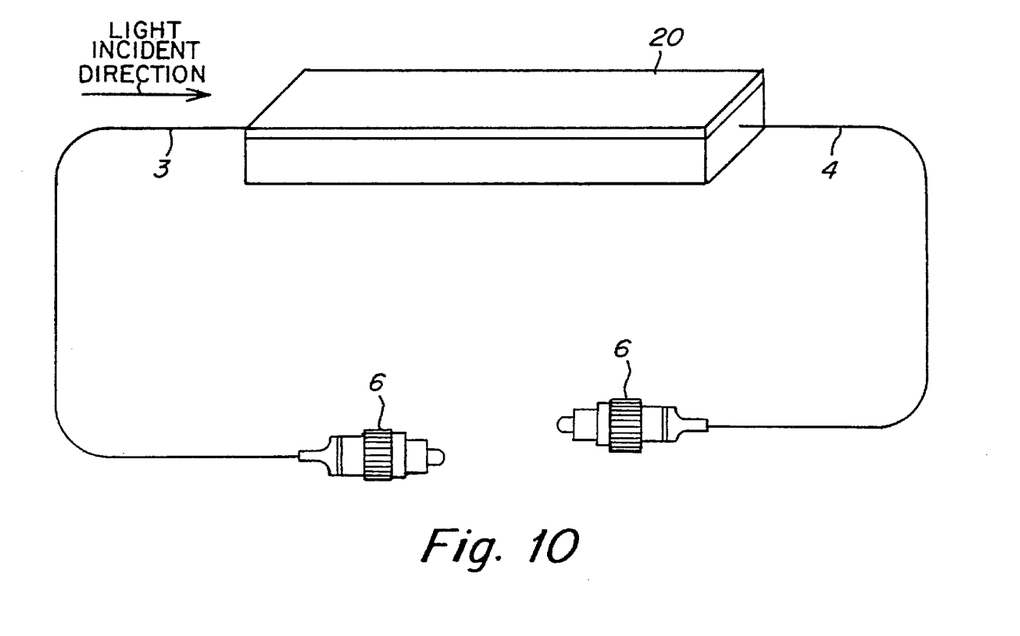
FIG. 10 shows an optical electric field sensor according to a sixth embodiment of this invention.

FIG. 10 shows an optical electric field sensor according to a sixth embodiment of this invention. Referring to FIG. 10, a Mach-Zehnder interferometer pattern similar to the conventional one illustrated in FIG. 2(a) was formed on a Z-cut substrate 21 of $LiNbO_3$ crystal by a Ti pattern. Then, an optical waveguide 12 was formed by thermal diffusion. Thereafter, an $SiO_2$ film was formed on a surface of the optical waveguide 12. A pattern of modulation electrodes 22 was formed thereon. For input and output of a laser beam, the optical waveguide was subjected to face polishing. A constant polarization optical fiber 3 and a single mode fiber 4 were connected to a light incident side and a light outgoing side, respectively. The element thus manufactured has an optical modulation characteristic as illustrated in FIG. 3, like in the conventional case. The foregoing structure is similar to that of the conventional case. Thereafter, according to the sixth embodiment of this invention, antennas 2 for electric field detection were connected to the modulation electrodes 22. An entire arrangement was packaged as illustrated in FIG. 10. The antennas are not illustrated in FIG. 10. The package was made up by the use of an organic adhesive and sealed so that the internal element is not affected by an outside air.

By the use of two kinds of vinyl chloride plates, namely, a vinyl chloride plate subjected to the antistatic treatment according to the sixth embodiment of this invention and a comparative vinyl chloride plate not subjected to any treatment, the packages were individually made up and subjected to measurement of electric charge. At first, the above-mentioned two kinds of packages were applied with electric fields of a same intensity. After lapse of a predetermined time duration, electric charges were measured and compared with each other. As a result, after 30 seconds from application of the electric field, no substantial electric charge was observed in the antistatic-treated package according to the sixth embodiment of this invention. On the other hand, in the package of the comparative example without any treatment, the electric charge was measured to correspond to approximately a half of the intensity of the applied electric field.

The above-mentioned result shows that the optical electric field sensor using the package according to the sixth embodiment of this invention is capable of carrying out optical modulation of an electric field to be measured alone. This is because no disturbance or influence is given to the ambient electric field by electrification of the package. In addition, according to the sixth embodiment of this invention, it is possible to provide the optical electric field sensor which is capable of removing an electrostatic field from the package material after packaging so as not to disturb the electric field to be measured. According to the sixth embodiment of this invention, it is possible to provide the optical electric field sensor which is capable of measuring the electric field free from an influence of disturbance by removing the electrostatic field generated from the package material even if the plastic material is used. According to the sixth embodiment of this invention, it is possible to provide the optical electric field sensor which has an excellent temperature characteristic, by suppressing the influence of the variation of the ambient temperature around the optical electric field sensor upon the optical crystal of the optical modulator. According to the sixth embodiment of this invention, it is possible not only to contribute to improvement of the temperature characteristic of the optical electric field sensor, which has been a problem in prior art, but also to provide the optical electric field sensor manufactured at a relatively low cost in a reduced process time with a high productivity.

As described above, according to the first through the sixth embodiments of this invention, it is possible to provide the optical electric field sensor having a structure of suppressing heat conduction of thermal fluctuation outside of the optical electric field sensor to the optical crystal so that any device of a high accuracy is unnecessary and the temperature characteristic is improved.

Industrial Application Field

As described above, the electric field sensor according to this invention is adapted to measurement of an electric field intensity within a spatial field, typically, EMC measurement (noise measurement).

We claim:

1. An optical electric field sensor which comprises:
   optical components including an optical crystal and which is for measuring an intensity of an electric field, spontaneously or forcedly generated, by the use of variation of at least one of an intensity, a phase, and a polarization direction of a light beam passing through said electric field; and
   wherein said optical components are arranged in a package made of a first heat insulation material.

2. An optical electric field sensor as claimed in claim 1, wherein said first heat insulation material is at least one material selected from a ceramics material and a glass material.

3. An optical electric field sensor as claimed in claim 2, wherein a main portion of a surface of said package is subjected to an abrasion treatment.

4. An optical electric field sensor as claimed in claim 1, wherein said electric field is applied through antennas connected to said optical crystal.

5. An optical electric field sensor as claimed in claim 1, wherein said package is fixedly surrounded by a second heat insulation material.

6. An optical electric field sensor as claimed in claim 5, wherein said second heat insulation material comprises expanded polystyrene foam.

7. An optical electric field sensor as claimed in claim 1, wherein:
   said optical components are arranged such that at least a pair of modulation electrodes are located in the vicinity of an optical waveguide formed on an optical crystal substrate having an electrooptical effect; and
   an electric field spontaneously or forcedly generated is led to said pair of modulation electrodes.

8. An optical electric field sensor which comprises:
   at least a pair o modulation electrodes located in the vicinity of an optical waveguide formed on an optical crystal substrate having an electrooptical effect and which is for measuring an electric field intensity by use of variation of at least one of an intensity, a phase, and a polarization direction of a light beam that is caused by leading to said pair of modulation electrodes an electric field spontaneously or forcedly generated; and
   wherein at least one of treatments is carried out which include application of conductive resin onto an entire surface of said optical crystal substrate and application of silicone between said modulation electrodes.

9. An optical electric field sensor as claimed in claim 8, wherein said optical crystal substrate is fixedly surrounded by a heat insulation material.

10. An optical electric field sensor which comprises:
    optical components including an optical crystal and which is for measuring an intensity of an electric field, spontaneously or forcedly generated, by use of variation of at least one of an intensity, a phase, and a polarization direction of a light beam passing through said electric field; and
    wherein said optical components are arranged in a package made of a plastic material having an antistatic-treated surface.

11. An optical electric field sensor as claimed in claim 10, wherein said plastic material comprises vinyl chloride.

12. An optical electric field sensor as claimed in claim 10, wherein a main portion of a surface of said package is subjected to an abrasion treatment.

13. An optical electric field sensor as claimed in claim 10, wherein said electric field is applied through antennas connected to said optical crystal.

14. An optical electric field sensor as claimed in claim 10, wherein said package is fixedly surrounded by a heat insulation material.

15. An optical electric field sensor as claimed in claim 14 wherein said heat insulation material comprises expanded polystyrene foam.

16. An optical electric field sensor as claimed in claim 10, wherein:
    said optical components are arranged such that at least a pair of modulation electrodes are located in the vicinity of an optical waveguide formed on an optical crystal substrate having an electrooptical effect; and
    an electric field spontaneously or forcedly generated is led to said pair of modulation electrodes.

* * * * *